United States Patent [19]
Kato et al.

[11] Patent Number: 6,051,465
[45] Date of Patent: Apr. 18, 2000

[54] METHOD FOR FABRICATING NONVOLATILE SEMICONDUCTOR MEMORY DEVICE

[75] Inventors: Junichi Kato; Atsushi Hori, both of Osaka, Japan

[73] Assignee: Matsushita Electronics Corporation, Osaka, Japan

[21] Appl. No.: 09/126,272

[22] Filed: Jul. 30, 1998

[30] Foreign Application Priority Data

Jul. 30, 1997 [JP] Japan .................................. 9-204909

[51] Int. Cl.$^7$ .............................................. H01L 21/8247
[52] U.S. Cl. ........................................... 438/258; 438/259
[58] Field of Search .................................... 438/257–267

[56] References Cited

U.S. PATENT DOCUMENTS

| | | | |
|---|---|---|---|
| 5,591,652 | 1/1997 | Matsushita . | |
| 5,780,341 | 7/1998 | Ogura ...................................... | 438/259 |
| 5,852,312 | 12/1998 | Ahn ......................................... | 257/321 |
| 5,888,868 | 3/1999 | Yamazaki et al. ....................... | 438/258 |
| 5,953,602 | 9/1999 | Oh et al. ................................. | 438/201 |
| 6,001,692 | 12/1999 | Gil .......................................... | 438/279 |

FOREIGN PATENT DOCUMENTS

| | | |
|---|---|---|
| 60-038881 | 2/1985 | Japan . |
| 63-058876 | 3/1988 | Japan . |
| 06120516 | 4/1994 | Japan . |
| 07115142 | 5/1995 | Japan . |
| 07130886 | 5/1995 | Japan . |

OTHER PUBLICATIONS

S. Samachisa, et al., "A 128K Flash EEPROM Using Double–Polysilicon Technology", IEEE Journal of Solid–State Circuits, vol. SC–22, No. 5, PP. 676–683, Oct. 1987.

S. Kianian, et al., "A Novel 3 Volts–Only, Small Sector Erase, High Density, Flash, E$^2$PROM", IEEE 1994 Symposium on VLSI Technology Digest of Technical Papers, PP. 71–72, 1994.

*Primary Examiner*—Richard Booth
*Attorney, Agent, or Firm*—McDermott, Will & Emery

[57] ABSTRACT

A method for fabricating a nonvolatile semiconductor memory device according to the present invention includes the steps of: forming a first mask to define a channel of a memory cell in a semiconductor substrate; doping an impurity into the semiconductor substrate by using the first mask, thereby forming a first doped region in the semiconductor substrate; forming a second mask so as to overlap at least one of a first region of the semiconductor substrate where a source is to be formed and a second region of the semiconductor substrate where a drain is to be formed and at least part of the first mask; etching the semiconductor substrate by using the first and second masks, thereby forming a recessed portion in a region of the semiconductor substrate that is not covered with the first and second masks; forming a second doped region in the recessed portion of the semiconductor substrate; and removing the first and second masks, and forming a gate structure including a first insulating film, a floating gate electrode, a second insulating film and a control gate electrode at least over a side surface of the recessed portion and the channel defined by the first mask.

15 Claims, 14 Drawing Sheets

METHOD FOR FABRICATING NONVOLATILE SEMICONDUCTOR MEMORY DEVICE

BACKGROUND OF THE INVENTION

The present invention relates to a method for fabricating a nonvolatile semiconductor memory device.

In recent years, nonvolatile semiconductor memory devices have been widely used as: storage media, to/from which data can be written and read out at a high speed, for portable electronic information processing units and memory cards; alternatives to magnetic storage media; or parts of high-performance LSI's. Thus, the nonvolatile semiconductor memory devices have significant industrial applicability.

A nonvolatile semiconductor memory device is disclosed, for example, in Japanese Laid-Open Publication No. 7-115142. Hereinafter, the structure of the nonvolatile semiconductor memory device and a method for fabricating the same will be described with reference to FIG. 11 and FIGS. 12A through 12E.

FIG. 11 is a cross-sectional view showing the structure of the nonvolatile semiconductor memory device described in the above-identified Japanese Laid-Open Publication No. 7-115142. As shown in FIG. 11, a step portion 102 is provided for a semiconductor substrate 101. A tunnel oxide film 104, a floating gate electrode 105, a capacitive insulating film 106 and a control gate electrode 107 are deposited in this order so as to overlap the upper- and lower-level surfaces of the step portion 102. In the regions located on right- and left-hand sides of the floating gate electrode 105 in the semiconductor substrate 101, highly doped source/drain regions 108 and 109 are respectively formed.

By providing the step portion 102 for the semiconductor substrate 101 and forming the floating gate electrode 105 to overlap the upper- and lower-level surfaces of the step portion 102, part of the floating gate electrode 105 exists in front of the direction in which channel hot electrons move, i.e., the average direction in which the velocity vectors are directed (the direction from left to right in FIG. 11) during the write operation for injecting electrons into the floating gate electrode 105. As a result, since the hot electrons can be injected into the floating gate electrode 105 more efficiently, the write efficiency is improved.

FIGS. 12A through 12E are cross-sectional views illustrating a method for fabricating the nonvolatile semiconductor memory device described in the above-identified Japanese Laid-Open Publication No. 7-115142.

First, in the process step shown in FIG. 12A, an element isolation region (not shown) is formed of a LOCOS film on the surface of a semiconductor substrate 101 made of P-type silicon. Then, an oxide film used as a mask for forming a step is formed over the entire surface of the substrate 101 and patterned, thereby forming an oxide film mask 111. And the substrate 101 is etched by using the oxide film mask 111 as a mask, thereby forming a step portion 102 in the semiconductor substrate 101.

Next, in the process step shown in FIG. 12B, arsenic ions are implanted by using the oxide film mask 111 as a mask and in accordance with large-angle-tilt ion implantation under the conditions where the implant angle is set at 30 degrees, the implant energy is set at 20 KeV and the dose is set at $1.0 \times 10^{15}$ cm$^{-2}$, thereby forming a lightly doped drain 103 in the semiconductor substrate 101 so as to cover the side and lower-level surfaces of the step portion 102. After the fabrication process is completed, the thickness of the lightly doped drain 103 reaches about 0.05 μm because of thermal diffusion of the implanted impurity.

Subsequently, in the process step shown in FIG. 12C, the oxide film mask 111 is removed and the semiconductor substrate 101 is thermally oxidized, thereby forming a silicon oxide film 104x having a thickness of about 10 nm on the surface of the semiconductor substrate 101. Then, CVD and thermal oxidation processes are further performed, thereby forming a CVD polysilicon film 105x having a thickness of about 200 nm, an ONO film 106x having a thickness of about 20 nm and a CVD polysilicon film 107x having a thickness of about 200 nm in this order on the silicon oxide film 104x.

Thereafter, in the process step shown in FIG. 12D, the respective films 104x, 105x, 106x and 107x are patterned, thereby forming a tunnel oxide film 104, a floating gate electrode 105, a capacitive insulating film 106 and a control gate electrode 107 (each having a stepped shape) so as to overlap the upper- and lower-level surfaces of the step portion 102.

Then, in the process step shown in FIG. 12E, arsenic ions are implanted by using the control gate electrode 107 and the underlying layers as a mask under the conditions where the implant energy is set at 50 KeV and the dose is set at $3.0 \times 10^{15}$ cm$^{-2}$, thereby forming a highly doped source/drain regions 108 and 109 in the respective regions of the semiconductor substrate 101 on right- and left-hand sides of the floating gate electrode 105. In this manner, a memory cell for the nonvolatile semiconductor memory device is formed.

In the subsequent process steps (not shown), an interlevel insulating film, contact holes, interconnections and the like are formed by performing known process steps.

In the process step shown in FIG. 12B for forming the lightly doped drain 103, the location of the drain 103 is determined by the oxide film mask 111 used when the step portion 102 is formed. On the other hand, in the process step shown in FIG. 12E for forming the source 108, the location of the source 108 is determined by the accuracy during the implantation of impurity ions using the floating gate electrode 105, the control gate electrode 107 and the other layers as a mask. Thus, depending upon the positional misalignment between a resist mask for forming the oxide film mask 111 and a resist mask for forming the floating gate electrode 105 and the other layers, the effective channel length of a resulting memory cell transistor adversely varies. Accordingly, in view of the fact that the positioning accuracy of a resist mask is about 0.1 μm according to the current photolithography technique, it is difficult to satisfactorily maintain the operating characteristics of a nonvolatile semiconductor memory device having an effective channel length, which is about to be reduced to about 0.3 μm.

The object of the present invention is to provide a nonvolatile semiconductor memory device having hot electron injection efficiency improved by providing a stepped floating gate electrode on the surface of a semiconductor substrate with a structure in which the effective channel length of a memory cell transistor does not depend on the positional misalignment between the masks used in a photolithography process for forming the gate electrode.

SUMMARY OF THE INVENTION

A method for fabricating a nonvolatile semiconductor memory device according to the present invention includes the steps of: forming a first mask to define a channel of a memory cell in a semiconductor substrate; doping an impurity into the semiconductor substrate by using the first mask, thereby forming a first doped region in the semiconductor substrate; forming a second mask so as to overlap at least one of a first region of the semiconductor substrate where a source is to be formed and a second region of the semiconductor substrate where a drain is to be formed and at least part of the first mask; etching the semiconductor substrate by using the first and second masks, thereby forming a recessed portion in a region of the semiconductor substrate that is not covered with the first and second masks; forming a second doped region in the recessed portion of the semiconductor substrate; and removing the first and second masks, and forming a gate structure including a first insulating film, a floating gate electrode, a second insulating film and a control gate electrode at least over a side surface of the recessed portion and the channel defined by the first mask.

Another method for fabricating a nonvolatile semiconductor memory device according to the present invention includes the steps of: covering an area of a semiconductor substrate with a first mask, the semiconductor substrate including an active region where source, drain and channel are to be formed, the area being an area where the channel is to be formed; forming a first doped region, including a part functioning as at least part of the source, by doping an impurity into the other areas of the active region that are not covered with the first mask; covering the area of the active region, where the source is to be formed, with a second mask; selectively etching an area of the active region, where the drain is to be formed, by using the first and second masks, thereby forming a recessed portion in the area where the drain is to be formed; forming a second doped region, functioning as at least part of the drain, under a lower-level surface of the recessed portion by using the first and second masks; and removing the first and second masks and forming a gate structure to cover the channel and a side surface of the recessed portion connected to the channel.

The method of the present invention provides a nonvolatile semiconductor memory device including: a semiconductor substrate having a surface including a first surface region at a first level, a second surface region at a second level lower than the first level, and a step side region linking the first and second surface regions together; a first insulating film formed on the surface of the semiconductor substrate; a floating gate formed on the first insulating film; a second insulating film formed on the floating gate; and a control gate capacitively coupled to the floating gate via the second insulating film. In the nonvolatile semiconductor memory device, a doped region is formed in the first surface region of the semiconductor substrate so as to be self-aligned with the step side region, and functions as at least part of the source during a write operation.

Another doped region, functioning as at least part of the drain during the write operation, is formed in the second surface region of the semiconductor substrate. The channel-side edge of the doped region is disposed at an appropriate position in the step side region.

DESCRIPTION OF THE PREFERRED EMBODIMENTS

Hereinafter, methods for fabricating a nonvolatile semiconductor memory device of the present invention will be described with reference to the accompanying drawings.

Embodiment 1

FIGS. 1A through 1H are cross-sectional views illustrating the process steps for fabricating a nonvolatile semiconductor memory device in the first embodiment of the present invention.

Figure 1A:
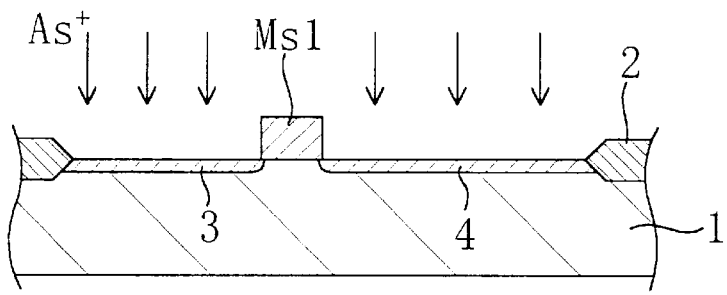
FIGS. 1A through 1H are cross-sectional views illustrating the process steps for fabricating a memory cell for a nonvolatile semiconductor memory device in the first embodiment of the present invention.
Figure 1B:
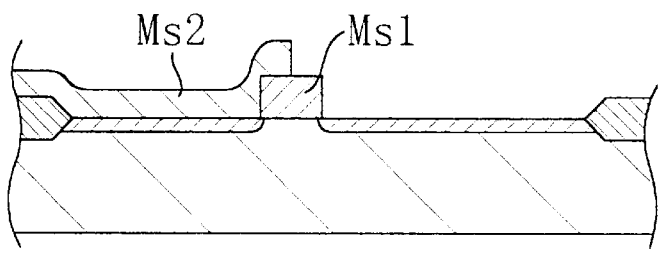

First, as shown in FIG. 1A, a protective oxide film (not shown) is formed by thermal oxidation on the surface of a semiconductor substrate 1 made of P-type single crystalline silicon and then an insulation oxide (field oxide) 2 is made of a LOCOS film. Thereafter, a first resist mask Ms1 is formed through lithography to define a region functioning as a channel of an MOS structure. By using the first resist mask Ms1 as an implant mask, arsenic ions are implanted into the substrate 1 under the conditions where the implant energy is set at 30 KeV and the dose is set at $1.0 \times 10^{15}$ cm$^{-2}$. In this way, arsenic ions are implanted into the regions of the semiconductor substrate 1 that are not covered with the first resist mask Ms1. As a result, a first lightly doped region 3 is formed in a region where the source is to be formed. By performing this ion implantation, arsenic ions are also implanted into a region 4 where the drain is to be formed, and another lightly doped region is formed in the region 4.

In this specification, an area of the active region of the semiconductor substrate 1 where a recessed portion is formed will be called a "region where the drain is to be formed", and an area located on the opposite side of the "region where the drain is to be formed" via the channel region will be called a "region where the source is to be formed", for the convenience of description. This is because at least part of the portion functioning as the drain during a write operation exists under the bottom of the recessed portion. However, depending on the configuration of a peripheral circuit employed, the doped region formed under the bottom of the recessed portion may function as the source during a read out operation.

Next, as shown in FIG. 1, a second resist mask Ms2 is formed through lithography to cover all the first lightly doped region 3 and part of the first resist mask Ms1, while leaving the first resist mask Ms1 as it is. That is to say, the second resist mask Ms2 partially overlaps the first resist mask Ms1.

Figure 1C:
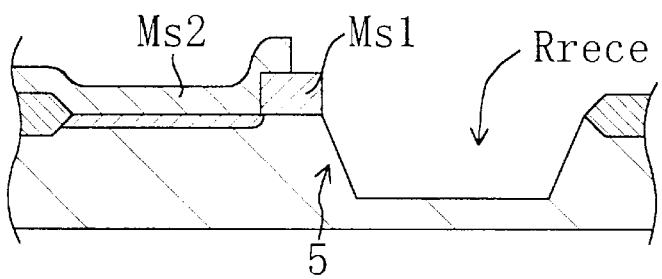

Subsequently, as shown in FIG. 1C, dry etching is performed by using the first and second resist masks Ms1 and Ms2 as etching masks, thereby etching away a portion of the active region of the semiconductor substrate 1 that is not covered with the first and second resist masks Ms1 and Ms2. A recessed portion Rrece is formed in the region where the drain is to be formed. The lower-level surface of the semiconductor substrate 1, which is located between the drain-side edge of the first resist mask Ms1 and that of the field oxide 2, is lower than the upper-level surface of the substrate 1 covered with the first resist mask Ms1 by several tens to several hundreds nanometers. Thus, a step portion 5, including: a non-etched surface or the upper-level surface (first surface region) of the semiconductor substrate 1; a side surface (step side region) extending downward from the drain-side edge of the first resist mask Ms1; and a lower-level surface (second surface region) extending from the lower end of the side surface in parallel to the upper-level surface of the semiconductor substrate 1, is formed. The channel-side edge of the first lightly doped region 3 is located to be distant from the upper end of the side surface of the step portion 5 substantially by the length of the first resist mask Ms1. That is to say, the first lightly doped region 3 is formed to be self-aligned with the step portion 5. In other words, the channel-side edge of the doped region functioning as the source during a write operation is self-aligned with the step side region. As can be understood, since the step portion 5 and the first lightly doped region 3 are both formed by using the same first resist mask Ms1, the variation in distances between the portion 5 and the region 3 is not caused in this embodiment, unlike the case where the use of different masks causes positional misalignment between the masks.

In this embodiment, the side surface of the step portion 5 is illustrated in the drawings as being inclined with respect to the upper-level surface of the semiconductor substrate 1. Alternatively, the side surface of the step portion 5 may be vertical to the upper-level surface of the semiconductor substrate 1.

Figure 1D:
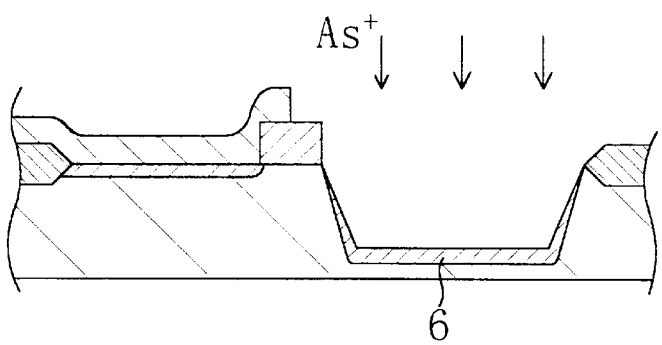
Figure 1E:
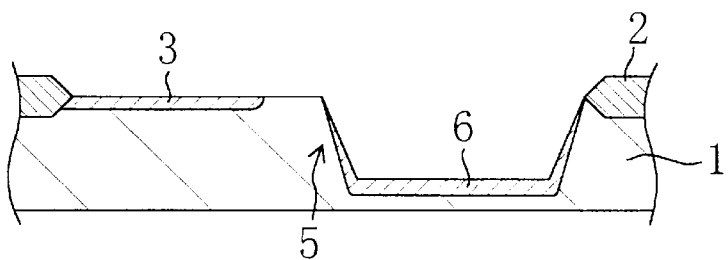

Next, as shown in FIG. 1D, arsenic ions are implanted by using the first and second resist masks Ms1 and Ms2 as implantation masks under the conditions where the implant energy is set at 30 KeV and the dose is set at $1.0 \times 10^{15}$ cm$^{-2}$, thereby forming a second lightly doped region 6, functioning as a lightly doped drain, under both side surfaces and bottom surface of the recessed portion Rrece. In this process step, since the second lightly doped region 6 is also formed by using the first resist mask Ms1, the distance between the first and second lightly doped regions 3 and 6 is not varied owing to the mask misalignment during photolithography, but is determined at a unique value depending on the size of the first resist mask Ms1. Thereafter, the first and second resist masks Ms1 and Ms2 are removed by ashing or the like.

Figure 1F:
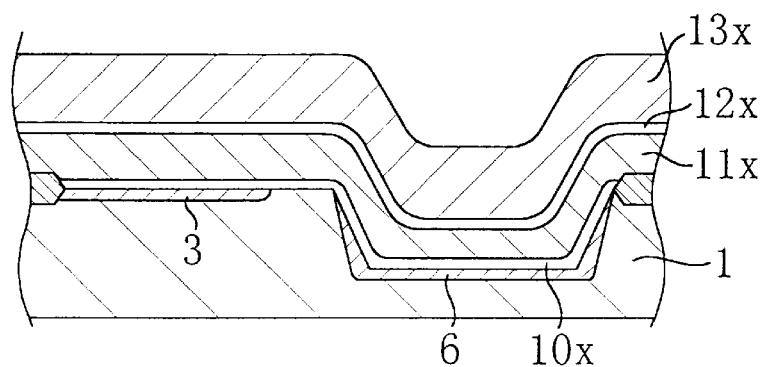

Then, as shown in FIG. 1F, a silicon oxide film (first insulating film) 10x having a thickness from 8 to 10 nm is formed by performing a thermal oxidation process. And by performing a CVD process, a thermal oxidation process and the like, a polysilicon film (first conductor film) 11x having a thickness of about 200 nm, an ONO film (i.e., a multi-layer film consisting of a silicon oxide film, a silicon nitride film and a silicon oxide film; second insulating film) 12x having a thickness of about 20 nm and a polysilicon film (second conductor film) 13x having a thickness of about 200 nm are formed in this order on the silicon oxide film 10x.

Figure 1G:
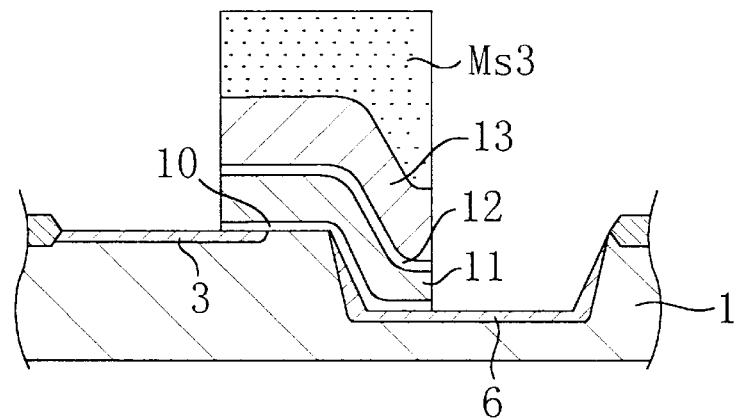

Subsequently, as shown in FIG. 1G, a third resist mask Ms3 covering a predetermined region including the step portion is formed. And the respective films 10x, 11x, 12x and 13x are patterned through etching using the third resist mask Ms3 as a mask, thereby forming a gate structure consisting of a tunnel oxide film 10, a floating gate electrode 11, a capacitive insulating film 12 and a control gate electrode 13 over the regions covering the upper-level surface, the side surface and the lower-level surface of the step portion 5. In this process step, patterning is performed such that part of the first lightly doped region 3 and part of the second lightly doped region 6 exist immediately under these members 10, 11, 12 and 13.

Figure 1H:
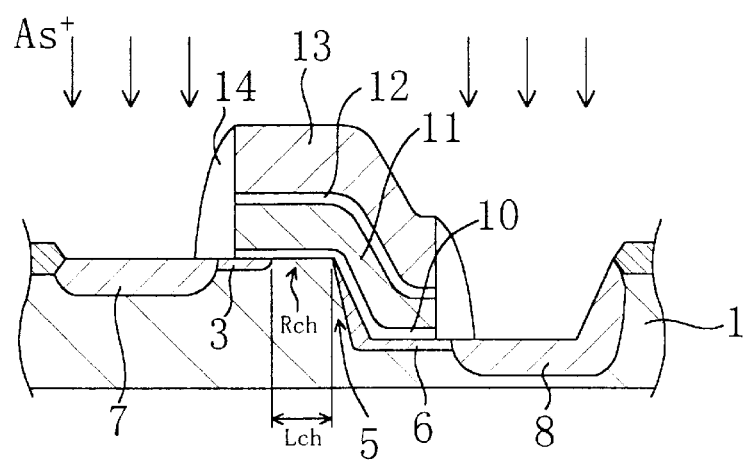

Thereafter, as shown in FIG. 1H, a silicon oxide film is deposited over the entire surface of the substrate 1 and subjected to anisotropic etching, thereby forming insulator sidewalls 14 on the side surfaces of the overall gate structure including the tunnel oxide film 10, the floating gate electrode 11, the capacitive insulating film 12 and the control gate electrode 13. Next, arsenic ions are implanted by using the gate structure including the control gate electrode 13, the floating gate electrode 11 and the other layers and the insulator sidewalls 14 as a mask under the conditions where the implant energy is set at 50 KeV and the dose is set at $3.0 \times 10^{15}$ cm$^{-2}$, thereby forming first and second highly doped regions 7 and 8, respectively functioning as highly doped source/drain regions. In this way, a nonvolatile memory cell including: the source/drain regions (i.e., the first and second lightly doped regions 3, 6 and the first and second highly doped regions 7, 8); the tunnel oxide film 10; the floating gate electrode 11; the capacitive insulating film 12; and the control gate electrode 13, is completed. In the subsequent process steps (not shown), an interlevel insulating film, contact holes, interconnections and so on are formed by performing known process steps.

As shown in FIG. 1H, the memory cell for the nonvolatile semiconductor memory device formed in accordance with the fabrication process steps of this embodiment includes the tunnel oxide film 10, the floating gate electrode 11, the capacitive insulating film 12 and the control gate 13 over the regions covering the upper-level surface, the side surface and the lower-level surface of the step portion 5. The region between the first and second lightly doped regions 3, 6 functions as a channel region Rch of a memory cell transistor.

In the memory cell formed in accordance with the fabrication process of this embodiment, the length Rch of the channel region, i.e., the effective channel length Lch, does not change even when the lateral positions of the tunnel oxide film 10, the floating gate electrode 11, the capacitive insulating film 12 and the control gate electrode 13 change. Specifically, in the process step shown in FIG. 1G, the position of the third resist mask Ms3 may deviate by about 0.1 μm, which is a mask alignment error that is usually involved because the accuracy of photolithography has a limit. Thus, between lots and even on the same wafer, the lateral positions of the tunnel oxide film 10, the floating gate electrode 11, the capacitive insulating film 12 and the control gate electrode 13 are likely to vary depending on the position where the memory cell is formed. However, the distance between the first and second lightly doped regions 3 and 6 does not change even when the position of the first resist mask Ms1 deviates. This is because these regions 3 and 6 are formed by using the same first resist mask Ms1 as shown in the process steps in FIGS. 1A and 1D. Thus, the variation in effective channel lengths, which usually results from the mask alignment error, can be eliminated and a highly accurate effective channel length Lch can be obtained with little variation.

Since the first lightly doped region 3 is formed before the gate structure is formed, the channel-side edge of the first lightly doped region 3 may be located at a position deep inside the gate immediately under the gate structure. That is to say, the channel-side edge may be located at a position close to the upper end of the side region of the step portion 5. In the case of forming the first lightly doped region 3 after the gate structure has been formed, the first lightly doped region 3 and the gate structure can be overlapped at most by a length substantially equal to the lateral diffusion length of the impurity in the first lightly doped region 3. By contrast, in accordance with the method of this embodiment, the overlap length between the first lightly doped region 3 and the gate structure may be adjusted arbitrarily. Thus, the overlap length between the first lightly doped region 3 and the gate structure may be set either longer or shorter than the diffusion length.

Next, the operation of the memory cell formed in accordance with the method of this embodiment will be described.

Figure 2:
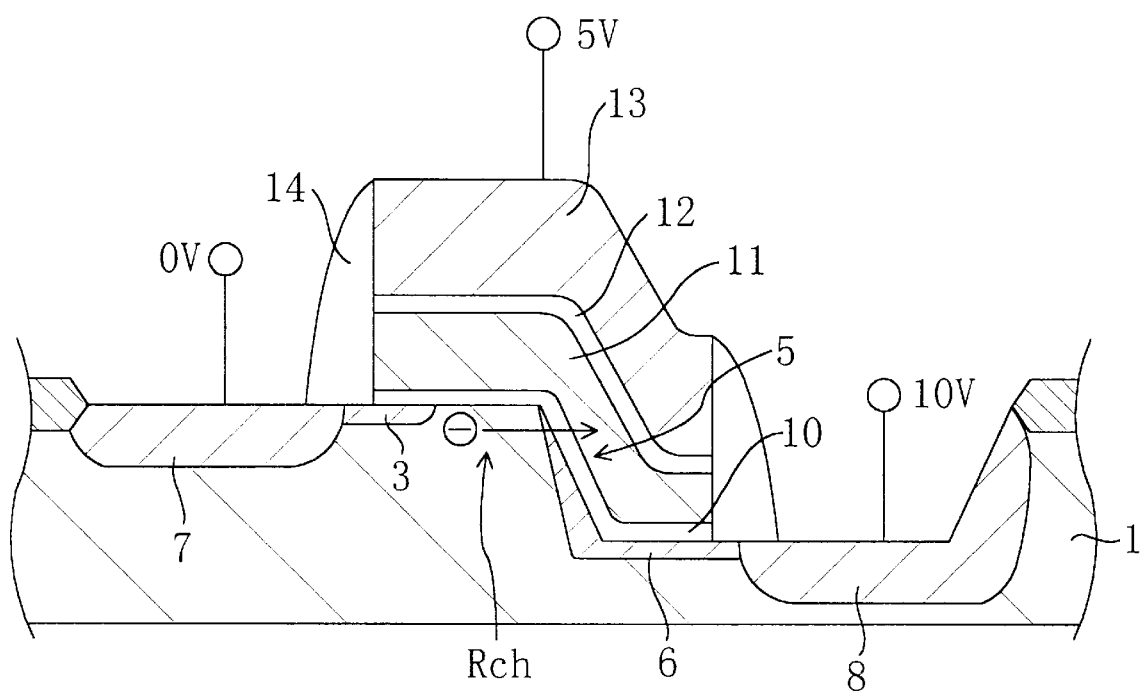
FIG. 2 is a cross-sectional view illustrating the write operation of the memory cell for the nonvolatile semiconductor memory device in the first embodiment.

FIG. 2 is a cross-sectional view illustrating the (write) operation of the memory cell injecting electrons into the floating gate electrode 11. As shown in FIG. 2, a ground potential of 0 V is applied to the first lightly doped region 3 and the first highly doped region 7, which function as the source. A high potential of 10 V is applied to the second lightly doped region 6 and the second highly doped region 8, which function as the drain. And an intermediate potential of 5 V is applied to the control gate electrode 13. Upon the application of the voltage to the control gate electrode 13, an inversion layer is formed in the channel region Rch. As a result, channel hot electrons flow in a direction from the first lightly doped region 3 toward the second lightly doped region 6. The directions of the velocity vectors of the channel hot electrons may be locally varied, but on average, are represented by the direction from left to right in FIG. 2. The average direction of the velocity vectors of the channel hot electrons is aligned with the direction from the first lightly doped region 3 toward a part of the floating gate electrode 11 located on the side surface of the step portion 5. Accordingly, the channel hot electrons can easily pass through the tunnel oxide film 10 to be injected into the floating gate electrode 11. In other words, very high write efficiency is realized.

Figure 3:
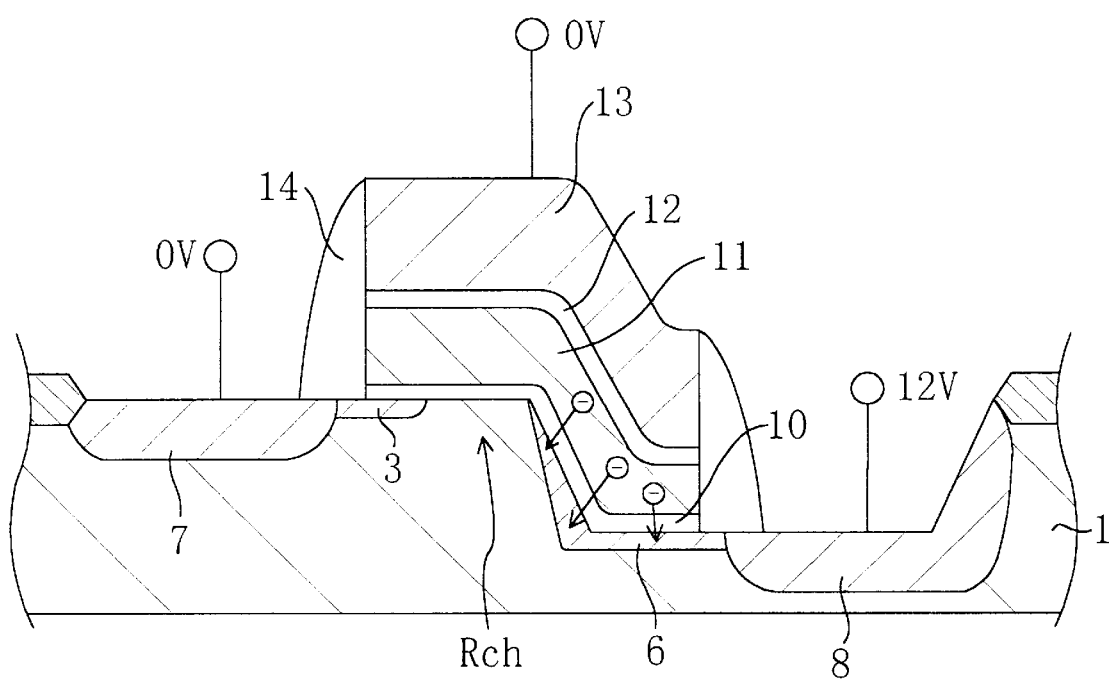
FIG. 3 is a cross-sectional view illustrating the erasure operation of the memory cell for the nonvolatile semiconductor memory device in the first embodiment.

FIG. 3 is a cross-sectional view illustrating the (erasure) operation of the memory cell taking out electrons from the floating gate electrode 11. As shown in FIG. 3, a ground potential of 0 V is applied to the first lightly doped region 3 and the first highly doped region 7, which function as the source, and to the semiconductor substrate 1. A high potential of 12 V is applied to the second lightly doped region 6 and the second highly doped region 8, which function as the drain. And a ground potential of 0 V is applied to the control gate electrode 13. Upon the application of these voltages, FN tunneling is caused and the electrons are removed from the floating gate electrode 11 into the second lightly doped region 6 or the second highly doped region 8 through the tunnel oxide film 10.

During the read out operation of the memory cell, a ground potential of 0 V is applied to the first lightly doped region 3, the first highly doped region 7 and the semiconductor substrate 1. An intermediate potential of 5 V is applied to the second lightly doped region 6 and the second highly doped region 8. And a low potential of 3 V is applied to the control gate electrode 13. If the electrons have been removed from the floating gate electrode 11 and current is flowing between the source and the drain, then it is determined that data "1" has been stored, for example. Conversely, if the electrons have been injected into the floating gate electrode 11 and no current is flowing between the source and the drain, then it is determined that data "0" has been stored, for example.

As can be understood, the memory cell structure of this embodiment can attain very high write efficiency. In addition, since the effective channel length Lch is substantially constant without producing any error because of the mask misalignment, the electrical characteristics, e.g., read out characteristics, of the memory cell can be improved.

Embodiment 2

Next, the second embodiment of the present invention will be described.

FIGS. 4A through 4E are cross-sectional views illustrating only the first half of the process steps for fabricating a nonvolatile semiconductor memory device in the second embodiment of the present invention.

Figure 4A:
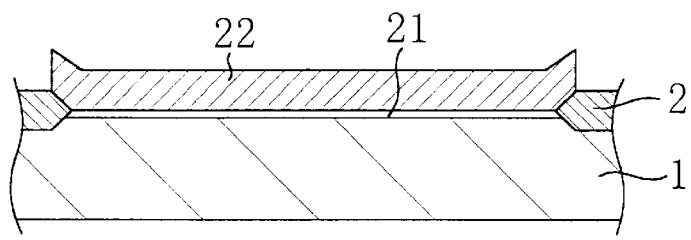
FIGS. 4A through 4E are cross-sectional views illustrating the first half of the process steps for fabricating a memory cell for a nonvolatile semiconductor memory device in the second embodiment of the present invention.

First, as shown in FIG. 4A, a protective oxide film 21 is formed by thermal oxidation over the entire surface of a semiconductor substrate 1 made of P-type silicon. Then, a silicon nitride film 22 is formed over the entire surface of the substrate 1 except for the regions where a field oxide is to be formed. By using the silicon nitride film 22 as a mask, thermal oxidation is performed to form the field oxide 2.

Figure 4B:
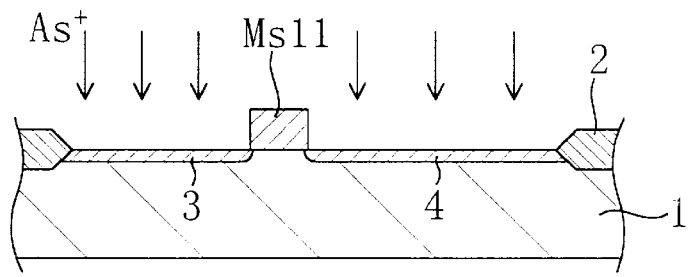

Thereafter, as shown in FIG. 4B, a resist mask (not shown) is formed to define a region functioning as the channel of an MOS structure. By performing etching with the resist mask, the silicon nitride film 22 is patterned to form a nitride mask Ms11. Then, by using the nitride mask Ms11 as an implant mask, arsenic ions are implanted into the substrate 1 under the conditions where the implant energy is set at 30 KeV and the dose is set at $1.0 \times 10^{15}$ cm$^{-2}$. In this way, a first lightly doped region 3 is formed in a region of the substrate 1 ranging from the source-side edge of the nitride mask Ms11 to that of the field oxide 2 (i.e., in the region where the source is to be formed). In this process step, arsenic ions are also implanted into a region 4 of the semiconductor substrate 1 ranging from the drain-side edge of the nitride mask Ms11 to that of the field oxide 2 (i.e., in the region where the drain is to be formed).

Figure 4C:
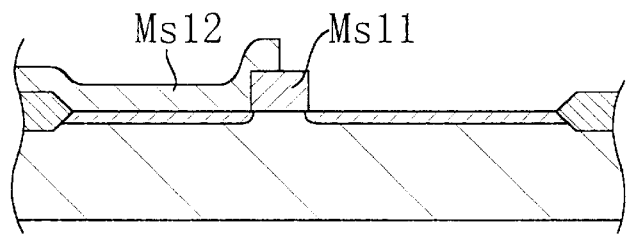

Next, as shown in FIG. 4C, a resist mask Ms12 is formed through lithography to cover all the first lightly doped region 3 and part of the nitride mask Ms11, while leaving the nitride mask Ms11 as it is. That is to say, the resist mask Ms12 partially overlaps the nitride mask Ms11.

Figure 4D:
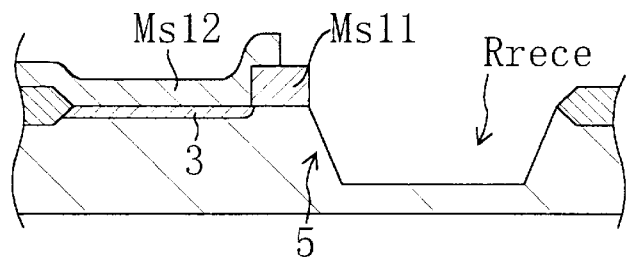

Subsequently, as shown in FIG. 4D, dry etching is performed by using the nitride mask Ms11 and the resist mask Ms12 as etching masks, thereby etching away a portion of the active region of the semiconductor substrate 1 that is not covered with the nitride mask Ms11 and the resist mask Ms12. A recessed portion Rrece is formed in the region where the drain is to be formed. The lower-level surface of the semiconductor substrate 1, which is located between the drain-side edge of the nitride mask Ms11 and that of the field oxide 2 is lower than the upper-level surface of the substrate 1 immediately under the nitride mask Ms11 by several tens to several hundreds nanometers. Thus, in the same way as in the first embodiment, a step portion 5 is formed at the end of the recessed portion Rrece. In this case, the upper end of the side surface of the step portion 5 is located at the same position as the drain-side edge of the nitride mask Ms11 in the same way as in the first embodiment.

Figure 4E:
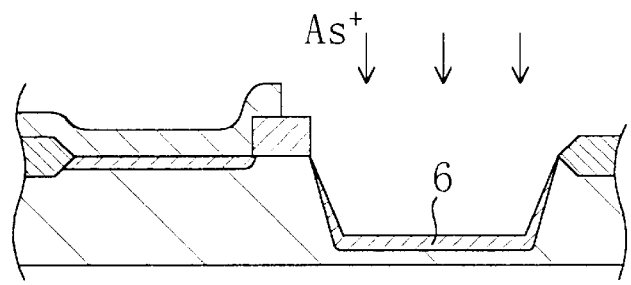

Next, as shown in FIG. 4E, arsenic ions are implanted by using the respective masks Ms11 and Ms12 as implant masks under the conditions where the implant energy is set at 30 KeV and the dose is set at $1.0 \times 10^{15}$ cm$^{-2}$, thereby forming a second lightly doped region 6, functioning as a part of the drain, in the vicinity of both side surfaces and lower-level surface of the recessed portion Rrece.

The illustration of the subsequent process steps is omitted herein. In brief, the same process steps as those illustrated in FIGS. 1E through 1H in the first embodiment are performed, thereby ultimately forming a memory cell having the same structure as that illustrated in FIG. 1H.

In the second embodiment, since a memory cell having the same structure as that of the first embodiment is obtained, the same effects as those of the first embodiment can also be attained. In addition, in this embodiment, the nitride mask Ms11 is formed in the process step shown in FIG. 4B, and the first lightly doped region 3 shown in FIG. 4B, the step portion 5 shown in FIG. 4D and the second lightly doped region 6 shown in FIG. 4E are formed by using this nitride mask Ms11. Thus, even when the resist mask Ms12 is subjected to heat treatment (baking) in the intervening process step shown in FIG. 4C, the mask Ms11 does not shrink. As a result, the size accuracy can be further improved as compared with the first embodiment.

In this embodiment, the isolation region is covered with a LOCOS film. However, the present invention is not limited to such an embodiment, but is applicable to a device having a so-called "trench isolation" structure. In such a case, the nitride film Ms11 can also be formed by using an etching stopper nitride film or the like for forming an isolating groove.

Embodiment 3

Next, the third embodiment of the present invention will be described.

FIGS. 5A through 5I are cross-sectional views illustrating the process steps for fabricating a nonvolatile semiconductor memory device in the third embodiment of the present invention.

Figure 5A:
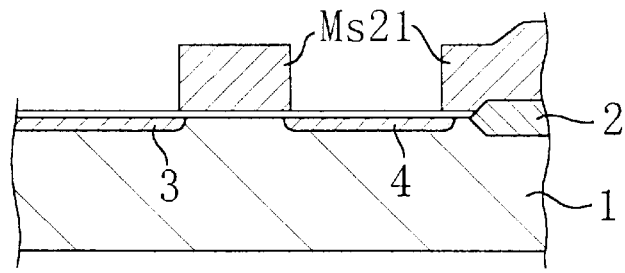
FIGS. 5A through 5I are cross-sectional views illustrating the process steps for fabricating a memory cell for a nonvolatile semiconductor memory device in the third embodiment of the present invention.

First, as shown in FIG. 5A, a protective oxide film (not shown) is formed by thermal oxidation on the surface of a semiconductor substrate 1 made of P-type silicon and then a field oxide 2 is made of a LOCOS film. Thereafter, a first resist mask Ms21 is formed through lithography to define a region functioning as the channel of an MOS structure. The first resist mask Ms21 extends from the edge of the field oxide 2 so as to partially cover the active region. Thereafter, by using the first resist mask Ms21 as an implant mask, arsenic ions are implanted into the substrate 1 under the conditions where the implant energy is set at 30 KeV and the dose is set at $1.0 \times 10^{15}$ cm$^{-2}$. In this way, a first lightly doped region 3 is formed in a region of the semiconductor substrate 1 ranging from the source-side edge of the first resist mask Ms21 to the field oxide. In this process step, arsenic ions are also implanted into a region 4 outside of the drain-side edge of the first resist mask Ms21.

Figure 5B:
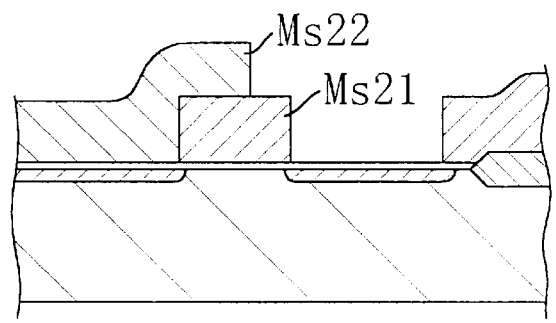

Next, as shown in FIG. 5B, a second resist mask Ms22 is formed through lithography to cover all the first lightly doped region 3 and part of the first resist mask Ms21, while leaving the first resist mask Ms21 as it is. That is to say, the second resist mask Ms22 partially overlaps the first resist mask Ms21.

Figure 5C:
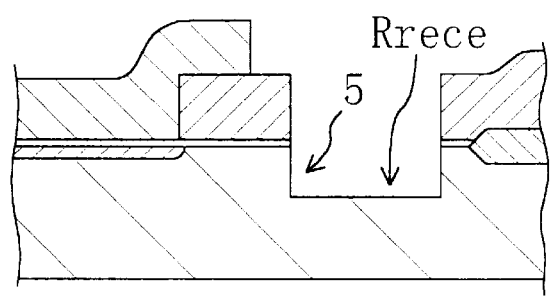

Subsequently, as shown in FIG. 5C, dry etching is performed by using the first and second resist masks Ms21 and Ms22 as etching masks, thereby etching away a portion of the semiconductor substrate 1 that is not covered with the first and second resist masks Ms21 and Ms22. As a result, a recessed portion Rrece is formed by the side of the drain-side edge of the first resist mask Ms21. The lower-level surface of the semiconductor substrate 1, which is located between the drain-side edge of the first resist mask Ms21 and that of the field oxide 2 is lower than the upper-level surface of the substrate 1. In this way, substantially the same step portion 5 as that of the first embodiment has been formed.

Figure 5D:
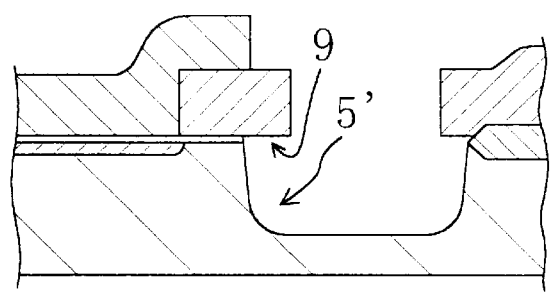

Then, as shown in FIG. 5D, wet etching is further performed by using the first and second resist masks Ms21 and Ms22, thereby expanding the recessed portion 5 in the depth direction and in the lateral direction. In this manner, an expanded step portion 5' is formed. A side-etched portion 9 is formed under the first resist mask Ms21 because wet etching is isotropic by nature.

Herein, the distance between the channel-side edge of the first lightly doped region 3 and the side surface of the step portion 5 before being side-etched is substantially equal to the length of the first resist mask Ms21. On the other hand, the distance between the channel-side edge of the first lightly doped region 3 and the side surface of the step portion 5' after being side-etched is substantially equal to "(the length of the first resist mask Ms21)–(wet etching amount)". The position of the channel-side edge of the first lightly doped region 3 and the position of the step portion 5' are self-aligned with each other. Since the step portion 5, the step portion 5' and the first lightly doped region 3 are all formed by using the same first resist mask Ms21, misalignment is not caused among the plurality of masks.

Figure 5E:
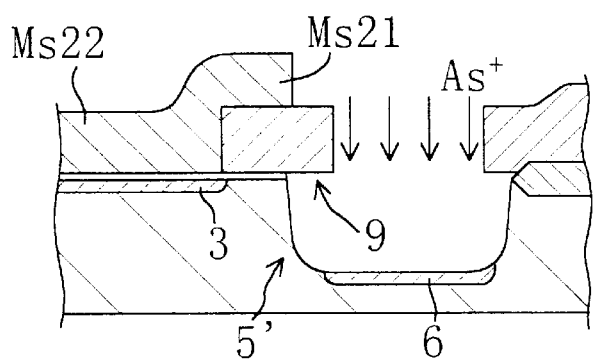

Next, as shown in FIG. 5E, arsenic ions are implanted by using the first and second resist masks Ms21 and Ms22 as implant masks under the conditions where the implant energy is set at 30 KeV and the dose is set at $1.0 \times 10^{15}$ cm$^{-2}$, thereby forming a second lightly doped region 6 in the bottom surface of the recessed portion Rrece.

Figure 5F:
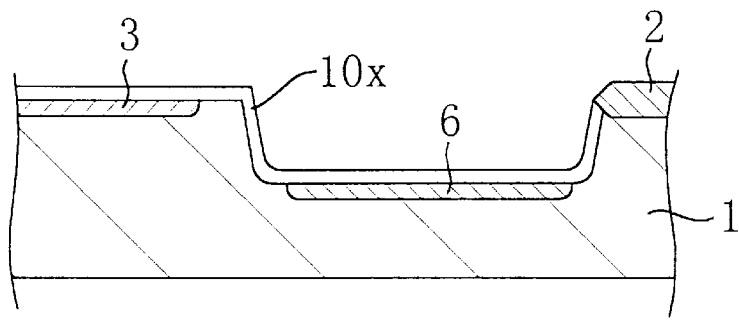

Then, as shown in FIG. 5F, the first and second resist masks Ms21 and Ms22 are removed through ashing or the like and a silicon oxide film 10x having a thickness from 8 to 10 nm is formed by thermal oxidation.

Figure 5G:
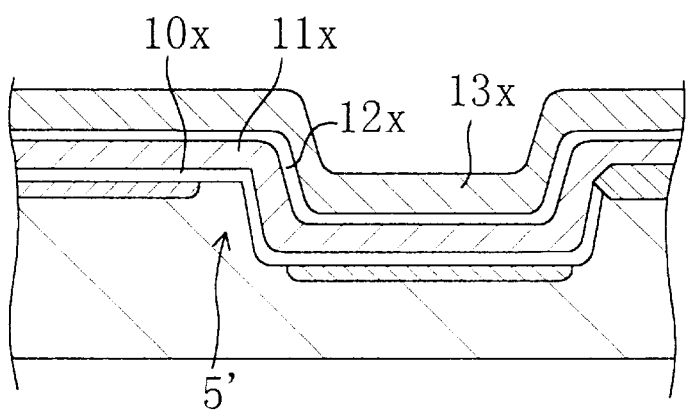

Next, as shown in FIG. 5G, by performing a CVD process, a thermal oxidation process and the like, a polysilicon film 11x having a thickness of about 200 nm, an ONO film 12x having a thickness of about 20 nm and a polysilicon film 13x having a thickness of about 200 nm are formed in this order on the silicon oxide film 10x.

Figure 5H:
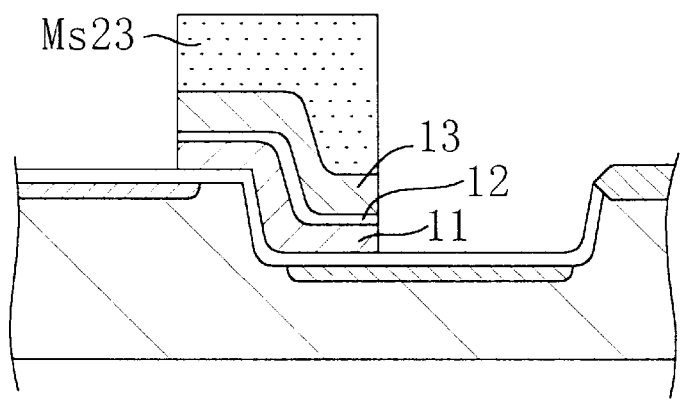

Subsequently, as shown in FIG. 5H, a third resist mask Ms23 covering a predetermined region including the step portion 5' is formed. And the respective films 10x, 11x, 12x and 13x are patterned through etching using the third resist mask Ms23 as an etching mask, thereby forming a tunnel oxide film 10, a floating gate electrode 11, a capacitive insulating film 12 and a control gate electrode 13 over the regions covering the upper-level surface, the side surface and the lower-level surface of the step portion 5'. In this process step, the patterning is performed such that part of the first lightly doped region 3 does not fail to exist immediately under these members 10, 11, 12 and 13.

Figure 5I:
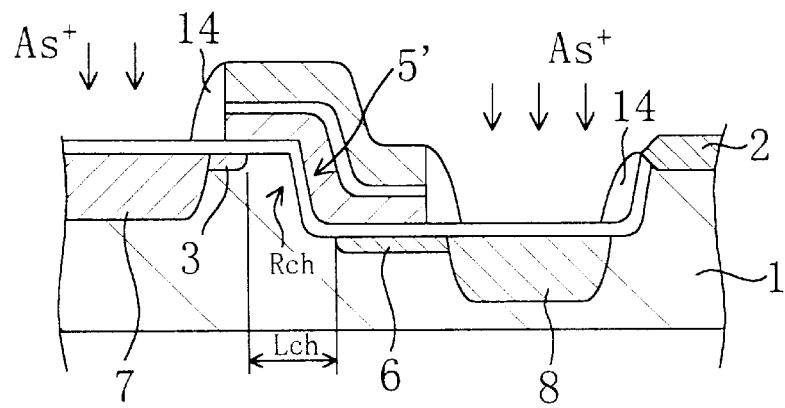

Thereafter, as shown in FIG. 5I, a silicon oxide film is deposited over the entire surface of the substrate 1 and subjected to anisotropic etching, thereby forming insulator sidewalls 14 on the side surfaces of the overall gate structure including the tunnel oxide film 10, the floating gate electrode 11, the capacitive insulating film 12 and the control gate electrode 13. Next, arsenic ions are implanted by using the gate structure including the control gate electrode 13 and the underlying layers and the insulator sidewalls 14 as a mask under the conditions where the implant energy is set at 50 KeV and the dose is set at $3.0\times10^{15}$ cm$^{-2}$, thereby forming first and second highly doped regions 7 and 8, respectively functioning as highly doped source/drain regions. In this way, a memory cell for a nonvolatile semiconductor memory device including: the source/drain regions (i.e., the first and second lightly doped regions 3, 6 and the first and second highly doped regions 7, 8); the silicon oxide film 10x functioning as the tunnel oxide film 10; the floating gate electrode 11; the capacitive insulating film 12; and the control gate electrode 13, is completed.

In the subsequent process steps (not shown), an interlevel insulating film, contact holes, interconnections and the like are formed by performing known process steps.

As shown in FIG. 5I, the memory cell for the nonvolatile semiconductor memory device formed in accordance with the fabrication process of this embodiment includes: the silicon oxide film 10x functioning as the tunnel oxide film 10; the floating gate electrode 11; the capacitive insulating film 12; and the control gate electrode 13 over the regions covering the upper-level surface, the side surface and the lower-level surface of the step portion 5'. The region between the first and second lightly doped regions 3, 6 functions as a channel region of a memory cell transistor.

In this embodiment, since the floating gate electrode 11 is formed over the regions covering the upper-level and side surfaces of the step portion 5', the same effects as those of the first embodiment can also be attained as a matter of principle. In addition, since the distance, corresponding to the effective channel length Lch, between the first and second lightly doped regions 3 and 6 can be adjusted depending upon the amount of wet etching, a structure optimizing the write efficiency and the read out characteristics in general is advantageously realized.

Figure 6A:
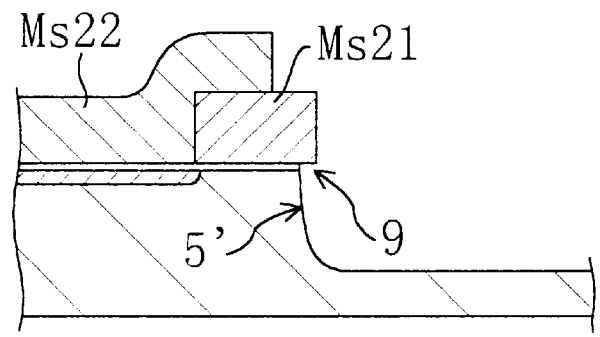
FIGS. 6A and 6B are cross-sectional views illustrating variant process steps of forming a step portion in the method for fabricating the memory cell for the nonvolatile semiconductor memory device in the third embodiment.
Figure 6B:
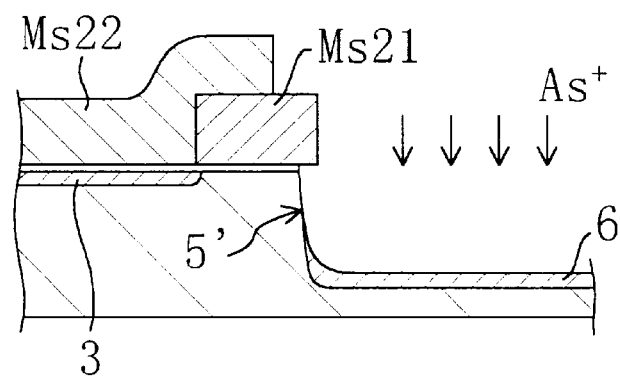

FIGS. 6A and 6B are cross-sectional views illustrating a part of the fabrication process steps in a modified embodiment of the third embodiment. In the process step shown in FIG. 6A, the lateral size of the side-etched portion 9, formed in the process step shown in FIG. 5D in the third embodiment, is reduced. In such a case, when arsenic ions are implanted in the process step shown in FIG. 6B, the second lightly doped region 6 is formed to reach the halfway point on the side surface of the step portion 5'.

Figure 7A:
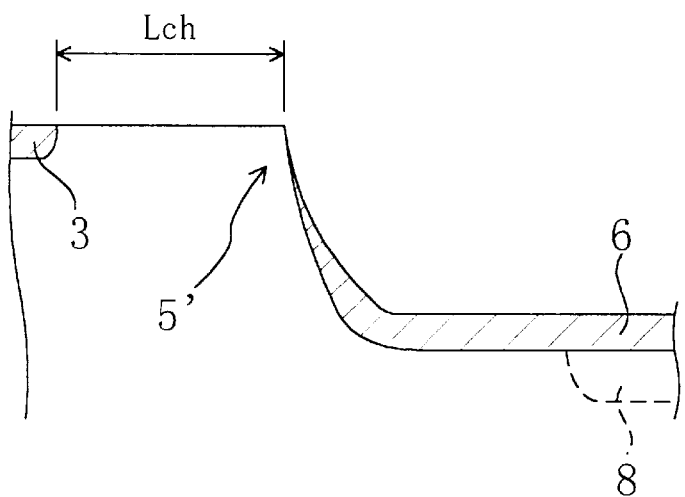
FIGS. 7A through 7C are cross-sectional views illustrating a method for adjusting a range in which a second lightly doped region is formed in the method for fabricating the memory cell for the nonvolatile semiconductor memory device in the third embodiment.
Figure 7B:
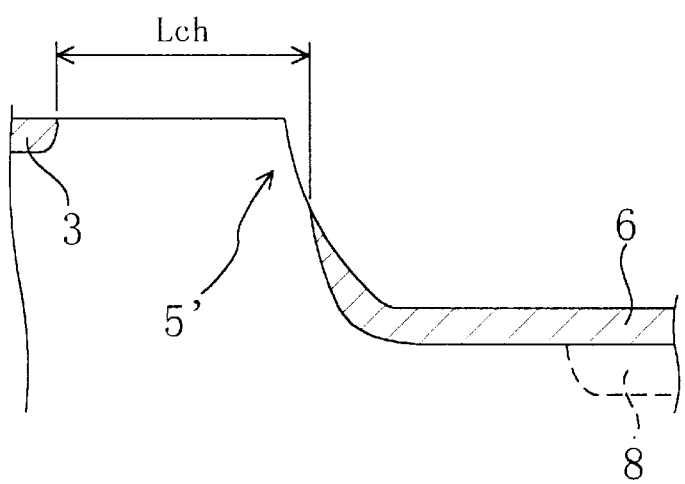
Figure 7C:
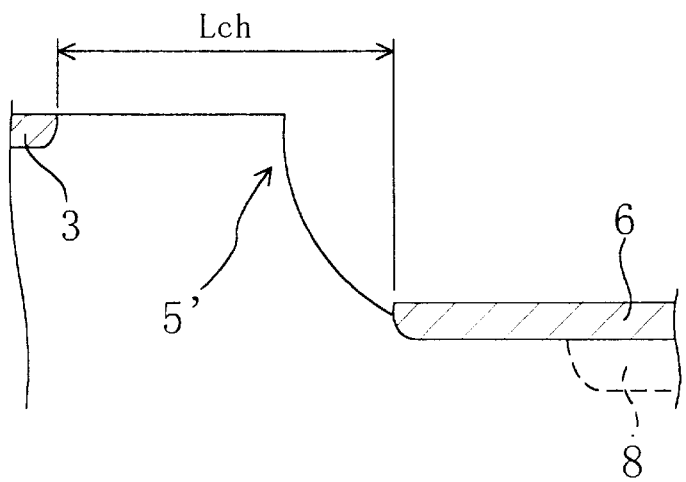

FIGS. 7A through 7C are cross-sectional views illustrating respective positional relationships between the step portion 5' and the first and second lightly doped regions 3 and 6 with respect to three different ranges in which the second lightly doped region 6 is formed. As shown in FIGS. 7A through 7C, the tilt angle, the etching amount and the like of the step portion 5' can be adjusted so as to optimize the write efficiency by regulating the position where the electric field is concentrated.

Moreover, in view of not only the write efficiency but also the read out characteristics, the tilt angle, the wet etching amount and the like of the step portion 5' may be adjusted so as to optimize the general characteristics.

Embodiment 4

Next, the fourth embodiment of the present invention will be described.

Figure 8:
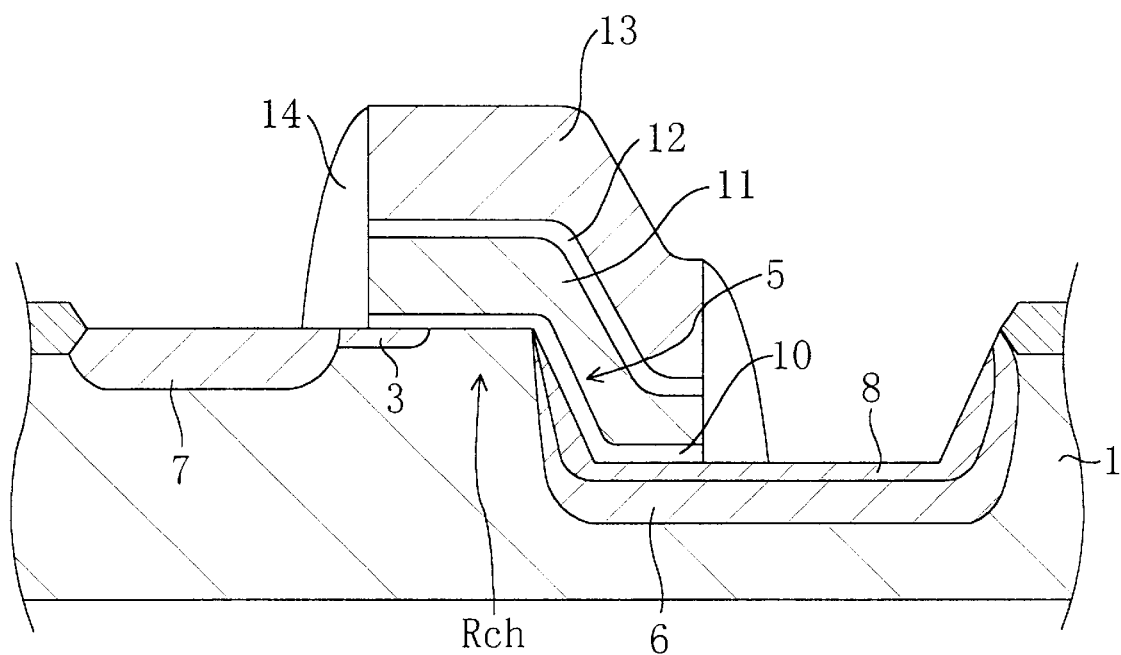
FIG. 8 is a cross-sectional view of a memory cell for a nonvolatile semiconductor memory device in the fourth embodiment of the present invention.

FIG. 8 is a cross-sectional view of a memory cell for a nonvolatile semiconductor memory device in the fourth embodiment. In the structure of the memory cell of this embodiment, fundamentally the same parts as the counterparts of the memory cell of the first embodiment will not be described, and only the different parts will be described below.

The memory cell of this embodiment is characterized by having a so-called "DDD structure" in which a second lightly doped region 6 (n$^-$ layer) is formed to surround a second highly doped region 8. The structure shown in FIG. 8 can be easily formed, for example, by implanting phosphorus ions at a low doping level with relatively large implant energy and implanting arsenic ions at a high doping level with smaller implant energy in the process step shown in FIG. 1D of the first embodiment.

The memory cell of this embodiment is characterized in that when a voltage of 12 V, for example, is applied to the region between the control gate electrode 13 and the second lightly doped region 6 and the second highly doped region 8 during the erasure operation for taking out electrons from the floating gate electrode 11, a high breakdown voltage is ensured. This is because current leaks from the second lightly doped region 6, functioning as an n$^-$ layer, into the semiconductor substrate 1. It is noted that if the first lightly doped region 3 and the first highly doped region 7 are used as drain during the read out operation, the short channel effects can be advantageously suppressed as is specific to an LDD structure.

Embodiment 5

Next, the fifth embodiment of the present invention will be described.

FIGS. 9A through 9E are cross-sectional views illustrating only the first half of the process steps for fabricating a nonvolatile semiconductor memory device in the fifth embodiment of the present invention. Since the second half thereof is the same as that of the first embodiment shown in FIGS. 1F through 1H, the illustration thereof will be omitted herein.

Figure 9A:
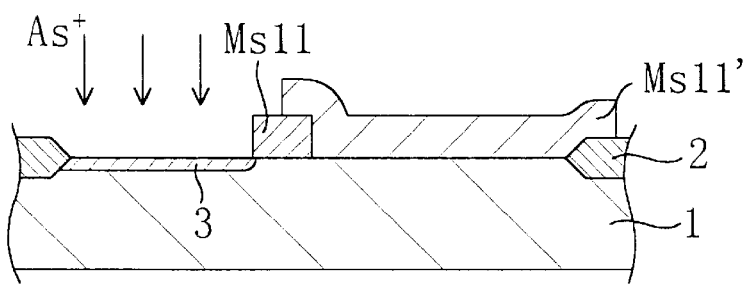
FIGS. 9A through 9E are cross-sectional views illustrating the first half of the process steps for fabricating a memory cell for a nonvolatile semiconductor memory device in the fifth embodiment of the present invention.

First, as shown in FIG. 9A, a protective oxide film (not shown) is formed by thermal oxidation over the entire surface of a semiconductor substrate 1 made of P-type silicon and then a field oxide 2 is made of a LOCOS film. Thereafter, by performing the same process steps as those shown in FIGS. 4A and 4B, for example, a nitride mask Ms11 is formed as a first mask to define a region functioning as the channel of an MOS structure. In addition, a mask Ms11', made of a silicon dioxide film, for example, is formed so as to cover a part of the nitride mask Ms11 and the entire region where the drain is to be formed. That is to say, the mask Ms11' partially overlaps the nitride mask Ms11. Then, by using the nitride mask Ms11 and the mask Ms11' as implant masks, arsenic ions are implanted into the substrate 1 under the conditions where the implant energy is set at 30 KeV and the dose is set at $1.0\times10^{15}$ cm$^{-2}$. In this way, a first lightly doped region 3 is formed in a region of the substrate 1 in which the source is to be formed. In this process step, arsenic ions are not implanted into the region covered with the mask Ms11', i.e., a region of the semiconductor substrate 1 between the drain-side edge of the nitride mask Ms11 and that of the field oxide 2. This is the point at which the fabrication process of this embodiment is different from that of the first embodiment.

Figure 9B:
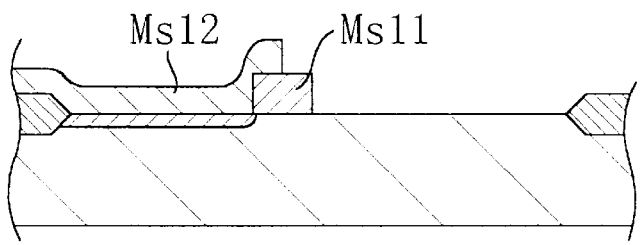

Next, as shown in FIG. 9B, the mask Ms11' is selectively removed, while leaving the nitride mask Ms11 as it is. Thereafter, a resist mask Ms12 is formed through lithography to cover the entire first lightly doped region 3 and part of the nitride mask Ms11. That is to say, the resist mask Ms12 partially overlaps the nitride mask Ms11.

Figure 9C:
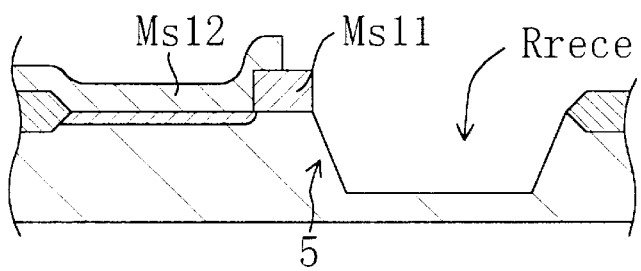

Subsequently, as shown in FIG. 9C, dry etching is performed by using the nitride mask Ms11 and the resist mask Ms12 as etching masks, thereby etching away a portion of the active region of the semiconductor substrate 1 that is not covered with the nitride mask Ms11 and the resist mask Ms12 and forming a recessed portion Rrece. The lower-level surface of the semiconductor substrate 1, located between the drain-side edge of the nitride mask Ms11 and that of the field oxide 2 is lower than the upper-level surface of the substrate 1 immediately under the nitride mask Ms11 by several tens to several hundreds nanometers. Thus, a step portion 5 is formed at the end of the recessed portion Rrece. In this case, the upper end of the side surface of the step portion 5 is located at the same position as the other end of the nitride mask Ms11 in the same way as in FIG. 1C of the first embodiment.

In this embodiment, the side surface of the step portion 5 is illustrated to be inclined with respect to the upper-level surface of the semiconductor substrate 1. Alternatively, the side surface of the step portion 5 may be vertical to the upper-level surface of the semiconductor substrate 1.

Figure 9D:
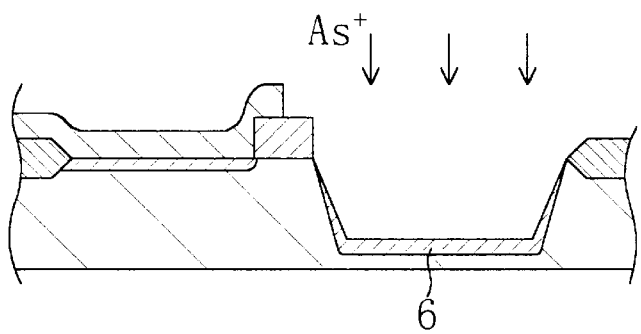

Next, as shown in FIG. 9D, arsenic ions are implanted by using the respective masks Ms11 and Ms12 as implant masks under the conditions where the implant energy is set at 30 KeV and the dose is set at $1.0\times10^{15}$ cm$^{-2}$, thereby forming a second lightly doped region 6 in the vicinity of both side surfaces and bottom surface of the recessed portion Rrece. In this process step, since the second lightly doped region 6 is also formed by using the nitride mask Ms11, the distance between the first and second lightly doped regions 3 and 6 is not varied owing to the mask misalignment during photolithography, but is determined at a unique value depending on the size of the nitride mask Ms11.

Figure 9E:
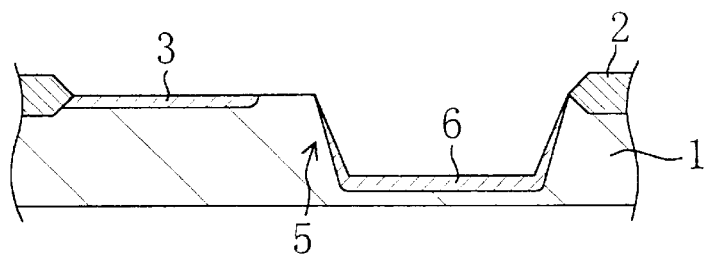

Thereafter, as shown in FIG. 9E, the masks Ms11 and Ms12 are removed by performing dry etching having a high selectivity with respect to silicon.

Then, the same process steps as those illustrated in FIGS. 1F through 1H are performed, thereby forming a memory cell for a nonvolatile semiconductor memory device including the first and second highly doped regions 7 and 8, the tunnel oxide film 10, the floating gate electrode 11, the capacitive insulating film 12 and the control gate electrode 13. Furthermore, an interlevel insulating film, contact holes, interconnections and the like are formed by performing known process steps.

The memory cell for a nonvolatile semiconductor memory device formed through the fabrication process of this embodiment has basically the same structure as that of the first embodiment. That is to say, since the region between the first and second lightly doped regions 3 and 6, which function as the source/drain regions, serves as a channel region Rch for a memory cell transistor. Thus, the same effects as those of the first embodiment can be attained. In addition, in accordance with the fabrication method of this embodiment, since the impurity is not implanted into the region adjacent to the drain-side edge of the nitride mask Ms11 in the process step shown in FIG. 9A, subtle variation in effective channel lengths can be totally eliminated. This is because, in this embodiment, the impurity, implanted during the previous process step, cannot have already existed in the second lightly doped region 6 formed in the process step shown in FIG. 9D, and because the impurity does not diffuse toward the region below the gate.

Embodiment 6

Next, the sixth embodiment of the present invention will be described.

FIGS. 10A through 10E are cross-sectional views illustrating only the first half of the process steps for fabricating a nonvolatile semiconductor memory device in the sixth embodiment of the present invention. Since the second half thereof is the same as that of the first embodiment shown in FIGS. 1F through 1H, the illustration thereof will be omitted herein.

Figure 10A:
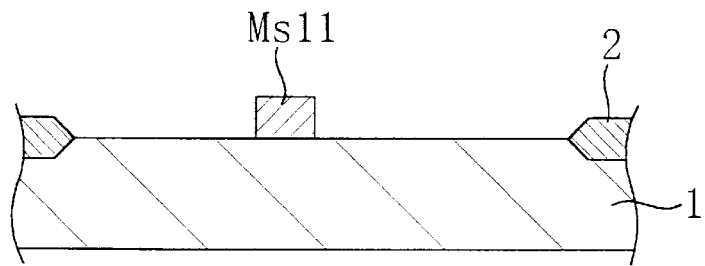
FIGS. 10A through 10E are cross-sectional views illustrating the first half of the process steps for fabricating a memory cell for a nonvolatile semiconductor memory device in the sixth embodiment of the present invention.

First, as shown in FIG. 10A, a protective oxide film (not shown) is formed by thermal oxidation over the entire surface of a semiconductor substrate 1 made of P-type silicon and then a field oxide 2 is made of a LOCOS film. Thereafter, by performing the same process steps as those shown in FIGS. 4A and 4B, for example, a nitride mask Ms11 is formed as a first mask to define a region functioning as the channel of an MOS structure. In this embodiment, the next process step is performed without performing impurity ion implantation. This is the point at which the fabrication process of this embodiment is different from any of the foregoing embodiments.

Figure 10B:
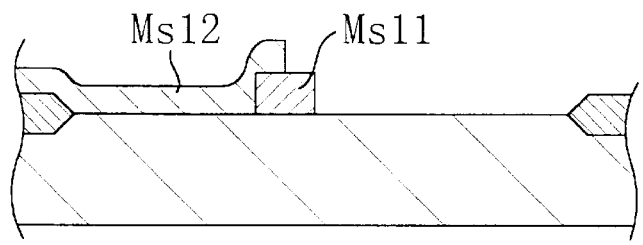

Next, as shown in FIG. 10B, a resist mask Ms12 is formed through lithography to cover a part of the active region where the source is to be formed and a part of the source-side edge of the nitride mask Ms11, while leaving the nitride mask Ms11 as it is. That is to say, the resist mask Ms12 partially overlaps the nitride mask MS11.

Figure 10C:
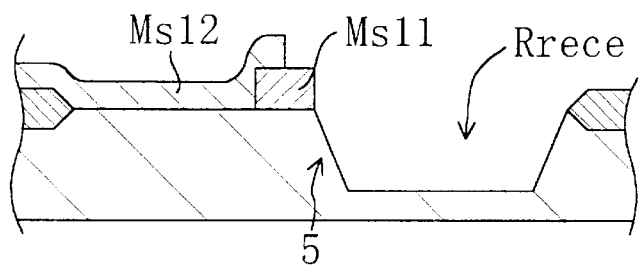

Subsequently, as shown in FIG. 10C, dry etching is performed by using the nitride mask MS11 and the resist mask Ms12 as etching masks, thereby etching away a portion of the active region of the semiconductor substrate 1 that is not covered with the nitride mask MS11 and the resist mask Ms12 and forming a recessed portion Rrece. The lower-level surface of the semiconductor substrate 1, located between the drain-side edge of the nitride mask Ms11 and that of the field oxide 2 is lower than the upper-level surface of the substrate 1 immediately under the nitride mask Ms11 by several tens to several hundreds nanometers. Thus, in the same way as in the first embodiment, a step portion 5 is formed at the end of the recessed portion Rrece. In this case, the upper end of the side surface of the step portion 5 is located at the same position as the other end of the nitride mask Ms11.

In this embodiment, the side surface of the step portion 5 is illustrated to be inclined with respect to the upper-level surface of the semiconductor substrate 1. Alternatively, the side surface of the step portion 5 may be vertical to the upper-level surface of the semiconductor substrate 1.

Figure 10D:
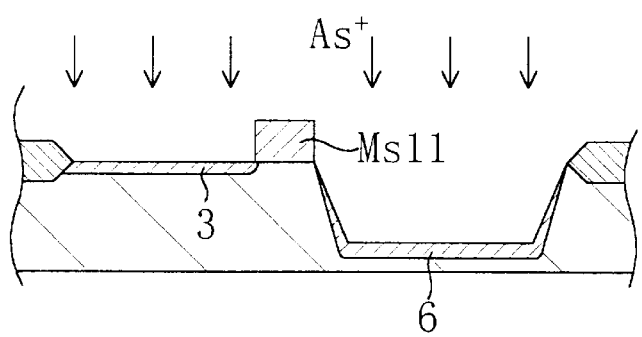

Next, as shown in FIG. 10D, the resist mask Ms12 is removed by ashing or the like. And arsenic ions are implanted into the regions of the semiconductor substrate 1 on right and left sides of the nitride mask Ms11 by using the nitride mask Ms11 as an implant mask under the conditions where the implant energy is set at 30 KeV and the dose is set at $1.0\times10^{15}$ cm$^{-2}$. By performing this process step, a first lightly doped region 3, including a part functioning as a part of the source, is formed in the region of the semiconductor substrate 1 in which the recessed portion is not formed and a second lightly doped region 6, including a part functioning as a part of the drain, is formed in the vicinity of both side surfaces and bottom surface of the recessed portion Rrece. The distance between the first and second lightly doped regions 3 and 6 is not varied owing to the mask misalignment during photolithography, but is determined at a unique value depending on the size of the nitride mask Ms11.

Figure 10E:
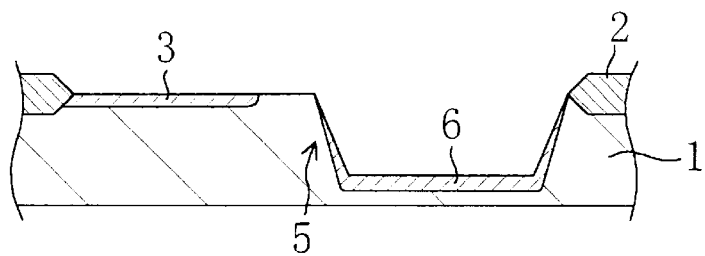
Figure 11:
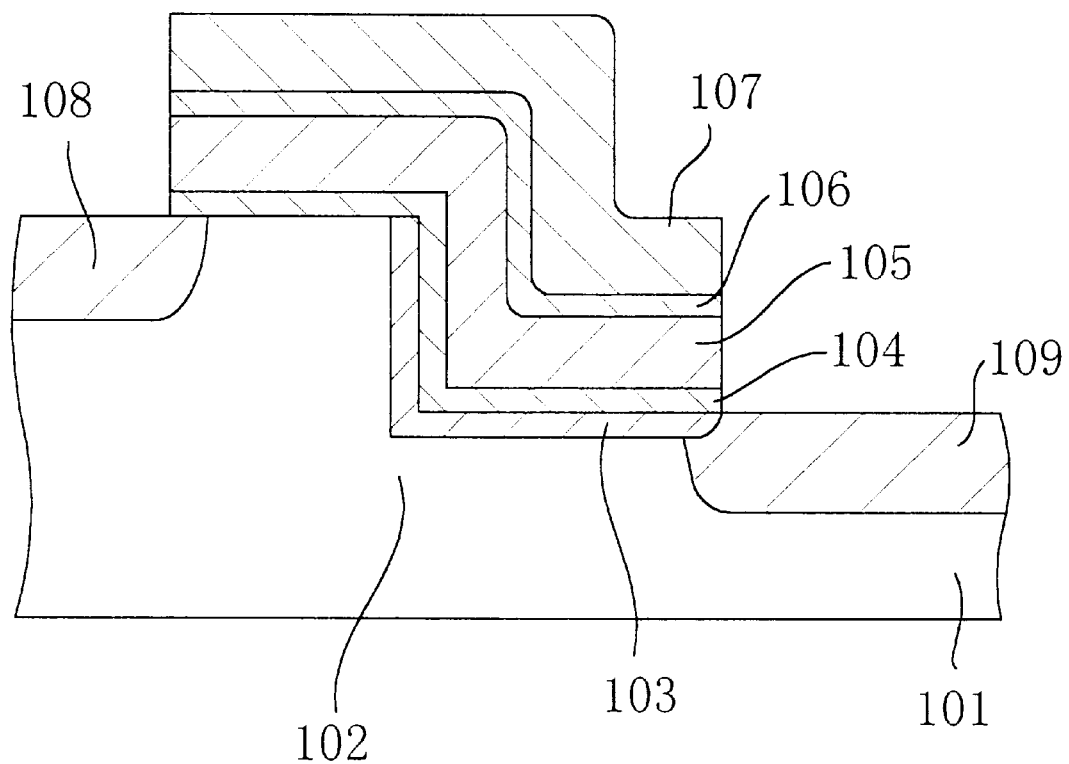
FIG. 11 is a cross-sectional view of a memory cell for a nonvolatile semiconductor memory device of prior art.
Figure 12A:
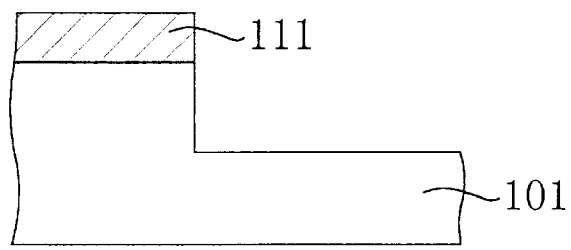
FIGS. 12A through 12E are cross-sectional views illustrating the process steps for fabricating the memory cell for the nonvolatile semiconductor memory device.
Figure 12B:
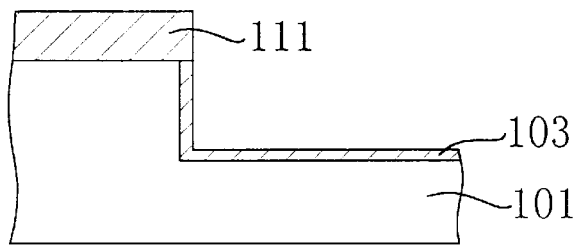
Figure 12C:
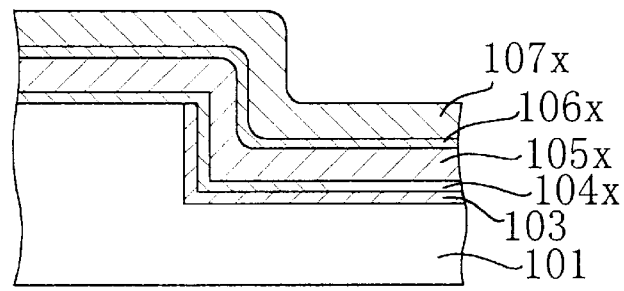
Figure 12D:
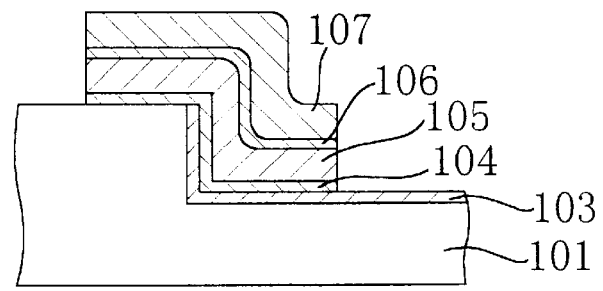
Figure 12E:
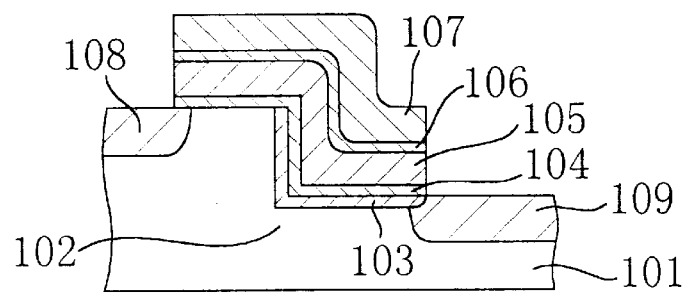

Thereafter, as shown in FIG. 10E, the nitride mask Ms11 is removed by performing dry etching having a high selectivity with respect to silicon.

A memory cell transistor thus formed includes: the oxide film 10; the floating gate electrode 11; the capacitive insulating film 12; and the control gate electrode 13. The region between the first and second lightly doped regions 3 and 6 functions as a channel region Rch of the memory cell transistor.

In accordance with the fabrication method of this embodiment, since the impurity is not implanted into the region by the side of the drain-side edge of the nitride mask Ms11 in the process step shown in FIG. 10A, subtle variation in effective channel lengths can be totally eliminated. This is because, the impurity, implanted during the previous process step, cannot have already existed in the second lightly doped region 6 formed in the process step shown in FIG. 10D, and because the impurity does not diffuse toward the region below the gate.

Other Embodiments

In each of the first to fourth embodiments, a structure including insulator sidewalls 14 is formed. However, it is not always necessary to form the insulator sidewalls 14. The reason is as follows. In any of the foregoing embodiments, a structure, in which the respective lightly doped regions 3 and 6 extend into the region under the floating gate electrode 11, can be formed easily. Thus, a sufficient distance can be secured between the drain-side edge of each lightly doped region 3, 6 and that of the associated highly doped region 7, 8. Nevertheless, if the insulator sidewalls 14 are formed, then in a subsequent process step, drain and source electrodes can be advantageously formed easily to be self-aligned with the source/drain regions.

In the first to the fifth embodiments, highly doped regions may be formed instead of the respective lightly doped regions at the same locations. In such a case, impurity ions are implanted at a high doping level and with relatively high energy in the respective process steps shown in FIGS. 1A and 1D, FIGS. 4B and 4E, FIGS. 5A and 5E, FIGS. 9A and 9D and FIG. 10D, and the ion implantation process steps shown in FIGS. 1H and 5I may be omitted. In such an embodiment, it is not always necessary to form the insulator sidewalls 14, either.

In the first to fourth embodiments, the floating gate electrode 11 and the control gate electrode 13 are patterned by using the same resist mask. However, the present invention is not limited to such an embodiment. That is to say, so long as the control gate electrode 13 and the floating gate electrode 11 establish a relationship enabling capacitance coupling therebetween, these electrodes 11 and 13 may be formed to mutually deviate from each other in the lateral direction.

In the first to the sixth embodiments, only the process steps for forming a memory cell have been described. Optionally, an MOS transistor may be simultaneously formed as a peripheral circuit. In such a case, if the gate electrode of the MOS transistor as a peripheral circuit is made of the same polysilicon film as that used for forming the control gate electrode 13 during the same process step, the number of the process steps can be reduced.

In all of the foregoing embodiments, the floating gate electrode 11 is formed over the regions covering the upper-level surface, the side surface and the lower-level surface of the step portion 5 or 5'. However, the present invention is not limited to such an embodiment. It is only necessary to form the floating gate electrode 11 so as to partially overlap the upper-level surface and the side surface of the step portion 5 or 5'.

The present invention is also applicable to a nonvolatile semiconductor memory device including a select gate in addition to the control gate. In such a case, in the structure shown in FIG. 1H, for example, the select gate electrode may be formed over the substrate 1 via a gate oxide film so as to be spaced apart from the control gate electrode 13 by a predetermined gap.

According to the present invention, a nonvolatile semiconductor memory device, having write efficiency improved, an effective channel length so increased as to obviate the necessity of considering a mask misalignment error and enhanced electrical characteristics, and being suitable for miniaturization, can be obtained.

What is claimed is:

1. A method for fabricating a nonvolatile semiconductor memory device, comprising the steps of:

forming a first mask to define a channel of a memory cell in a semiconductor substrate;

doping an impurity into the semiconductor substrate by using the first mask, thereby forming a first doped region in the semiconductor substrate;

forming a second mask so as to overlap at least one of a first region of the semiconductor substrate where a source is to be formed and a second region of the semiconductor substrate where a drain is to be formed and at least part of the first mask;

etching the semiconductor substrate by using the first and second masks, thereby forming a recessed portion in a region of the semiconductor substrate that is not covered with the first and second masks;

forming a second doped region in the recessed portion of the semiconductor substrate; and removing the first and second masks, and forming a gate structure including a first insulating film, a floating gate electrode, a second insulating film and a control gate electrode at least over a side surface of the recessed portion and the channel defined by the first mask.

2. The method of claim 1, wherein in the step of forming the second doped region, the second doped region is formed in a region of the semiconductor substrate including at least part of the side surface of the recessed portion by doping an impurity into the semiconductor substrate by using the first and second masks.

3. The method of claim 1, wherein the step of forming the gate structure comprises the steps of:

forming a first insulating film on an exposed surface of the semiconductor substrate;

depositing a first conductor film on the first insulating film;

patterning the first conductor film, thereby forming the floating gate electrode to cover at least part of the side surface of the recessed portion and the channel; and forming a second insulating film on the floating gate electrode and a control gate electrode capacitively coupled to the floating gate electrode via the second insulating film.

4. The method of claim 1, wherein the step of forming the first doped region comprises the steps of:

forming a third mask overlapping the region of the semiconductor substrate where the recessed portion is to be formed; and introducing the impurity into the semiconductor substrate by using the first mask and the third mask.

5. The method of claim 3, further comprising the step of forming a transistor for a peripheral circuit in a region on the semiconductor substrate, which region is different from the region where the memory cell is formed, wherein the step of forming the gate structure includes the step of forming the control gate electrode and a gate electrode of the transistor by depositing and patterning a second conductor film.

6. The method of claim 1, wherein the step of forming the recessed portion in the semiconductor substrate comprises the step of side-etching the semiconductor substrate laterally from a position immediately under an edge of the first mask by performing isotropic etching, and wherein the step of forming the second doped region is performed by implanting impurity ions.

7. The method of claim 6, wherein the step of forming the recessed portion in the semiconductor substrate comprises the step of performing anisotropic etching.

8. The method of claim 1, further comprising, prior to the step of forming the first mask, the steps of:

forming an active-region-covering film over an active region of the semiconductor substrate; and forming element isolation to surround the active region by using the active-region-covering film as a mask, wherein in the step of forming the first mask, the first mask is formed by patterning the active-region-covering film.

9. The method of claim 1 or 8, wherein the first mask is made of a nitride film.

10. The method of claim 1, further comprising, posterior to the step of forming the gate structure, the step of doping an impurity, having the same conductivity type as that of the impurity in the first doped region, into the semiconductor substrate by using the floating gate electrode as a mask.

11. A method for fabricating a nonvolatile semiconductor memory device, comprising the steps of:

covering an area of a semiconductor substrate with a first mask, the semiconductor substrate including an active region where source, drain and channel are to be formed, the area being an area where the channel is to be formed;

forming a first doped region, including a part functioning as at least part of the source, by doping an impurity into the other areas of the active region that are not covered with the first mask;

covering the area of the active region, where the source is to be formed, with a second mask;

selectively etching an area of the active region, where the drain is to be formed, by using the first and second masks, thereby forming a recessed portion in the area where the drain is to be formed;

forming a second doped region, functioning as at least part of the drain, under a lower-level surface of the recessed portion by using the first and second masks; and removing the first and second masks and forming a gate structure to cover the channel and a side surface of the recessed portion connected to the channel.

12. The method of claim 11, wherein the step of forming the recessed portion comprises the step of side etching the semiconductor substrate through isotropic etching.

13. The method of claim 11 or 12, wherein the step of forming the second doped region is performed by implanting impurity ions.

14. The method of claim 11, further comprising, prior to the step of forming the first mask, the steps of:

forming a film covering the active region of the semiconductor substrate; and forming isolation outside the active region, wherein the first mask is made of the film covering the active region by patterning the film.

15. The method of claim 11, further comprising, posterior to the step of forming the gate structure, the step of doping an impurity, having the same conductivity type as the impurity in the first doped region, into the active region of the semiconductor substrate by using the gate structure as a mask.

* * * * *